(12) United States Patent
Bhat et al.

(10) Patent No.: US 7,804,330 B2
(45) Date of Patent: Sep. 28, 2010

(54) ADAPTIVE KEEPER CIRCUIT TO CONTROL DOMINO LOGIC DYNAMIC CIRCUITS USING RATE SENSING TECHNIQUE

(75) Inventors: Navakanta Bhat, Bangalore (IN); David Rakesh Gnana Jeyasingh, Bangalore (IN)

(73) Assignee: Indian Institute of Science, Bangalore, IN (US)

( * ) Notice: Subject to any disclaimer, the term of this patent is extended or adjusted under 35 U.S.C. 154(b) by 0 days.

(21) Appl. No.: 12/438,719

(22) PCT Filed: Jun. 26, 2007

(86) PCT No.: PCT/IN2007/000259

§ 371 (c)(1),
(2), (4) Date: Feb. 24, 2009

(87) PCT Pub. No.: WO2008/146299

PCT Pub. Date: Dec. 4, 2008

(65) Prior Publication Data

US 2010/0073030 A1   Mar. 25, 2010

(30) Foreign Application Priority Data

May 31, 2007   (IN)   .................. 01130/CHE/2007

(51) Int. Cl.
*H03K 19/096* (2006.01)
(52) U.S. Cl. ..................... 326/98; 326/95; 365/203
(58) Field of Classification Search .................. 326/93, 326/95, 98; 365/203
See application file for complete search history.

(56) References Cited

U.S. PATENT DOCUMENTS 6,956,406 B2 * 10/2005 Seningen et al. ............ 326/121

\* cited by examiner

*Primary Examiner*—Daniel D Chang
(74) *Attorney, Agent, or Firm*—Lathrop & Gage LLP (57) ABSTRACT

The present invention provides an adaptive keeper circuit to control Domino Logic Dynamic Circuits using Rate Sensing Technique to provide reduced contention and efficient process tracking at given noise robustness with less overhead in area, power and delay, said adaptive keeper comprising, keeper PMOS transistor (M1), wherein the drain of M1 is connected to wide AND-OR logic circuit; the rate controller consisting of reference rate transistor (M4), feedback PMOS transistor (M2), feedback shutoff transistor (M5), clock shut-off transistor (M6), pre-charge PMOS transistor (M3), wherein the input of the rate controller is directly connected to drain of the keeper PMOS (M1) and the output of the rate controller is directly connected to the gate of the PMOS keeper (M1).

15 Claims, 3 Drawing Sheets

| Keeper Type | fNsP(ps) | sNfP(ps) | ΔD | Noise Overhead |
|---|---|---|---|---|
| No keeper | 100 | 134 | - | - |
| Conventional | 190 | 520 | 173% | 44% |
| Conditional | 141 | 313 | 122% | 20% |
| Replica Current | 207 | 256 | 24% | 38% |
| Rate Sensing keeper | 132 | 160 | 21% | 4% |

Figure 5

ADAPTIVE KEEPER CIRCUIT TO CONTROL DOMINO LOGIC DYNAMIC CIRCUITS USING RATE SENSING TECHNIQUE

FIELD OF THE INVENTION

The present invention relates to an adaptive keeper circuit to control Domino Logic Dynamic Circuits using Rate Sensing Technique to provide reduced contention and efficient process tracking at a given noise robustness with less overhead in area, power and delay.

BRIEF DESCRIPTION OF ACCOMPANYING DRAWINGS

The invention will be described in greater detail below in connection with accompanying drawing figures, in which.

BACKGROUND OF THE INVENTION AND PRIOR ARTS

Figure 1:
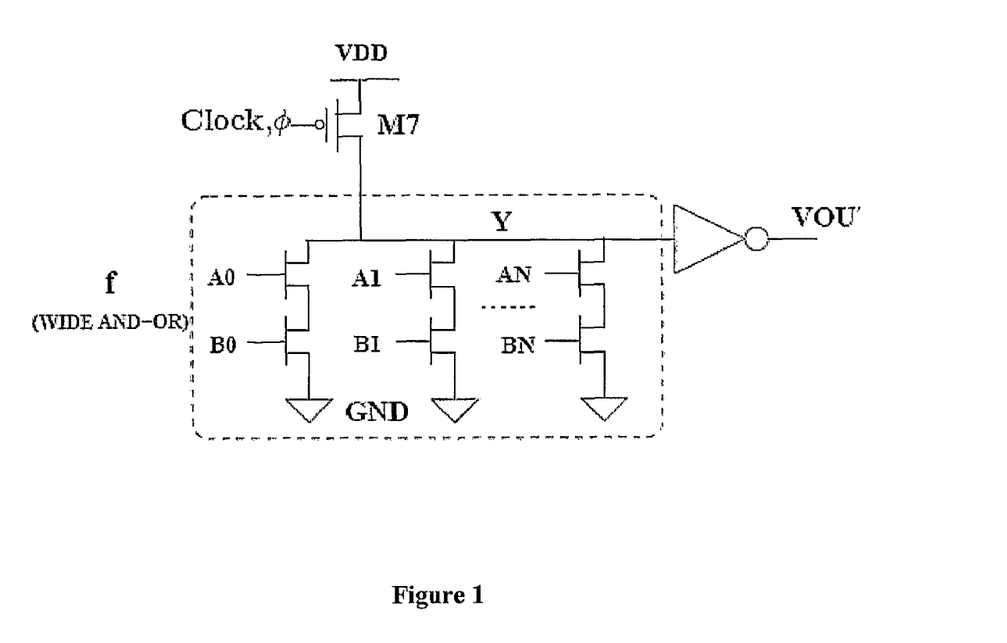
FIG. 1 shows Typical Dynamic gate topology

Speed and power are the major performance metrics of digital circuits, especially microprocessors which are the major drivers for sub-100 nm CMOS technology. However variation in threshold voltage during fabrication causes a wide variation in the speed and leakage power both within-die (WID) and die-die (D2D). This in turn affects the yield of the chips, that meet certain performance specification. The common solution to this problem is to design the circuit for worst case variation. However this is too pessimistic and will result in a large degradation in the performance of the chip. This is because only a small fraction of the millions of transistors in the die need to be tuned to meet the target power and performance. The major challenge in circuit design lies in controlling these devices selectively and adapting them to work efficiently in a specific process corner. In this aspect the dynamic gates draw a lot of attention. Dynamic circuits have found a widespread use in microprocessors and other high speed designs because of their lower logical efforts compared to the other logic styles such as static CMOS. A static CMOS implementation requires the use of a PMOS and an NMOS transistor for each input. Also the PMOS has to be sized larger compared to NMOS, to get the same drive strength. Thus for wide AND-OR like structures the load capacitance on each input becomes very high. However the dynamic circuits use a clocked pre-charge transistor and a bottom pull-down NMOS stack to implement a given logic. FIG. 1 shows a typical domino gate topology, where f represents a wide AND-OR NMOS logic. In the negative half cycle of the clock φ (precharge phase) the dynamic node is pre-charged high through the PMOS transistor. During the positive half cycle (evaluation phase) the dynamic node is either discharged or is held high based on the input data. Thus when the node is floating high in evaluation phase, it is susceptible to leakage and other coupling noises. For a wider pull-down logic the leakage through the NMOS pull-down legs can destroy the state of the floating node. To avoid this a keeper transistor is normally used with an inverter feedback to hold the state of the dynamic node. There are certain tradeoffs involved in designing the keeper.

Figure 2:
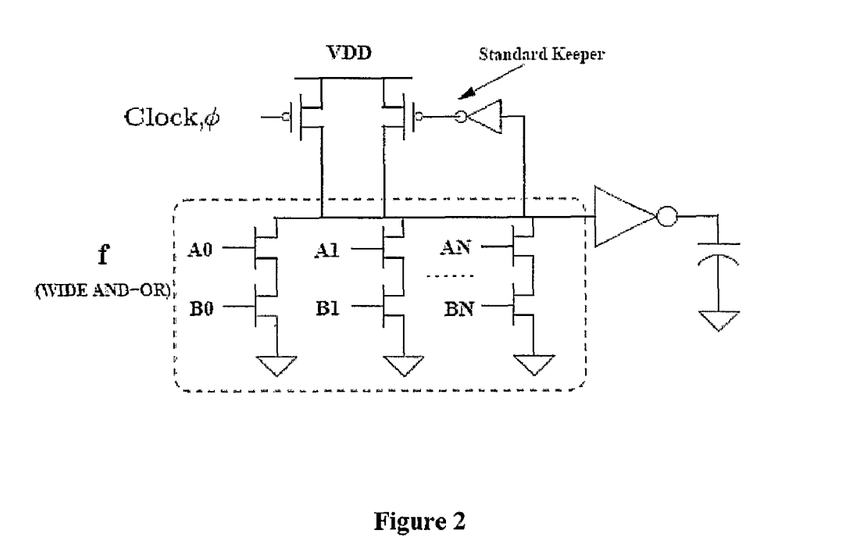
FIG. 2 shows A Domino gate with Conventional Keeper

FIG. 2 shows a wide AND-OR domino gate with a conventional keeper, consisting of a weak PMOS and a feedback inverter, that is traditionally used to hold the state when the pull-down stack is OFF during evaluation. However in technologies below 130 nm, the leakage current has increased tremendously and the variation in the device threshold has also gone up. Further, the increasing functionality on the chip demands a wider pull down logic. The above factors pose a requirement that the keeper should be strong enough to hold the dynamic state in the fast corner when the pull-down stack is OFF.

Also in the slow corner the contention current from the keeper should be less than the ON current of a single pull-down leg for the dynamic node to switch its state. These conditions require that the keeper should have a good tracking over different process corners and must have scalability with the increasing pull-down width.

In case of conventional keeper technique the keeper is on at the start of the evaluation phase. If one of the pull-down legs turn on, a large contention current flows through the keeper that slows down the falling transition. As the dynamic node comes down, the keeper PMOS goes from linear region to saturation region resulting in an increasing contention current until the output of the feedback inverter rises sufficiently to turn off the keeper. In case of wider gates if the keeper is sized for the worst case leakage it can result in a situation where the contention current exceeds the on current of a single NMOS and prevent the node from switching. Another important metric of the dynamic circuits is the robustness of the gate to power supply variation and other coupling noises. A linear increase in noise voltage at the gate causes the leakage current to increase exponentially and hence the keeper has to be designed accordingly to achieve the target robustness of the gate. In case of conventional keeper, the noise robustness can be improved by increasing the keeper size. This causes the delay of the dynamic gate to increase exponentially.

The keeper upsizing also has a severe impact on the power. Excess power is wasted in the keeper due to a large contention current and in the feedback inverter due to short circuit current because of the longer fall time of the dynamic node voltage. The conventional keeper cannot be used for wider pull-down legs because the keeper size required to maintain the robustness is too huge that during evaluation the logic fails to switch due to the larger contention current. Thus upsizing the keeper is certainly not the right way for achieving robustness. Also the variation in the NMOS leakage is not tracked by the PMOS keeper.

Techniques [1] [2] [3] propose a process tracking conventional keeper design, where in the dynamic node is loaded with a number of parallel keepers of unit width. These keepers can then be turned on selectively based on the process corner. The corner information is obtained from an additional circuitry which in turn generates digital codes to control the keepers. This technique still has the problem of contention and also a large area overhead to generate the corner information.

Techniques [4] [5] suggest a method for reducing the contention during evaluation period. The input data to the wide dynamic gates are ready before or close to the start of the evaluation phase. In such a case, the maximum time window for any potential output transition is only a fraction of the total evaluation time. The conventional keeper turns on unconditionally at the start of the evaluation phase, degrading the performance of the gate. However in the conditional keeper technique, the keeper is weak during the output transition window and strong for the rest of the evaluation time, if the dynamic node should remain high. The weak keeper during the transition window results in reduced contention and a faster output transition, while the strong keeper during the rest of the evaluation time results in a good robustness to leakage and noise.

Technique [6] proposes a replica current mirror method that tracks the various process corners very closely. A replica of the pull-down stack generates a reference leakage current, which in turn is mirrored into the dynamic node to compensate for the leakage. The replica NMOS has a width equal to that of the pull-down logic. The gate of the replica transistor is connected to VSS through a diode connected PMOS at the top. The PMOS mirror voltage is then used to control the keeper current. The mirror voltage varies based on the process corners. This technique can track the systematic process variations in the chip. Another advantage of this design is that the same replica circuit can be used to mirror the current to several other dynamic gates of same equivalent width.

The limitations of the prior art techniques are explained below.

1. The conventional keeper design results in huge contention current and lacks process tracking. This has limited the number of pull-down legs in the nano-CMOS technologies.

2. The process tracking keeper technique [1] has significant contention current during the evaluation phase. Also since the keeper dimensions are fixed, finer control of the keeper current is not possible. Moreover this technique does not track the dynamic variations in temperature and noise.

3. The conditional keeper technique [4], although reduces the contention current by delaying the clock to the strong keeper, lacks process tracking. The inverter delays do not track the process corners. Also with increasing noise robustness required at the gate, the conditional keeper turns on early and it tends towards a conventional keeper in its performance.

4. The current mirror technique [6] closely tracks the process corners. However in a given process corner the amount of contention is still high due to the feedback keeper.

5. The feedback keeper technique in general results in a lot of short circuit power dissipation in the keeper PMOS and also in the feedback inverter.

6. The area overhead in case of current mirror technique is large. In order to achieve a better process tracking the keeper should be in close proximity to the pull-down logic. If a single current mirror is used for the entire design then it can result in variation in the bias currents.

7. There is a tradeoff between the performance and noise immunity of the dynamic gates. Higher the noise immunity required larger is the delay.

OBJECTS OF THE INVENTION

The primary object of the present invention is to overcome the limitations of prior arts (conventional keeper circuits) as mentioned above.

Yet another object of the present invention relates to provide an adaptive keeper circuit to control Domino Logic Dynamic Circuits using Rate Sensing Technique to provide reduced contention and efficient process tracking at a given noise robustness with less overhead in area, power and delay.

Still another object of the present invention is an adaptive keeper technique which ensures that the keeper is OFF at the start of the evaluation phase resulting in reduced contention and high speed.

Still another object of the present invention is to provide a method of operating the circuit to achieve aforementioned objects.

STATEMENT OF INVENTION

Accordingly, the present invention provides an adaptive keeper circuit to control Domino Logic Dynamic Circuits using Rate Sensing Technique to provide reduced contention and efficient process tracking at a given noise robustness with less overhead in area, power and delay, said adaptive keeper comprising, keeper PMOS transistor (M1), wherein the drain of M1 is connected to wide AND-OR logic circuit; rate controller consisting of reference rate transistor (M4), feedback PMOS transistor (M2), feedback shutoff transistor (M5), clock shutoff transistor (M6), pre-charge PMOS transistor (M3), wherein the input of the rate controller is directly connected to drain of the keeper PMOS (M1) and the output of the rate controller is directly connected to the gate of the PMOS keeper (M1), and also a method of operating an adaptive keeper circuit to control Domino Logic Dynamic Circuits using Rate Sensing Technique to provide reduced contention and efficient process tracking at a given noise robustness with less overhead in area, power and delay by maintaining a node Y at a voltage VDD during evaluation phase as demanded by the input logic, said method comprising steps of; generating reference rate by appropriately biasing reference rate transistor M4 using VBIAS; charging the node Y to VDD through transistor M7 to cause feedback transistor M2 to shut OFF and node VSEN to VDD through pre-charge transistor M3 causing transistors M6 and M1 to shut OFF during pre-charge phase when clock signal is low; discharging the charged node VSEN at rate higher than the charged node Y causing the keeper transistor M1 to pump a larger current into node Y compared to leakage current of pull down NMOS logic which causes M2 to turn ON slowly; replenishing all the leaked charge to the node Y using the pumped current which in-turn causes the transistor M2 to slowly shut off; and accelerating the discharge of node VSEN to turn ON the keeper transistor M1 faster, causing the transistor M1 to turn on pulling the node Y back to VDD and thereby shutting the feedback transistor M2 off, and a method of operating an adaptive keeper circuit to control Domino Logic Dynamic Circuits using Rate Sensing Technique to provide reduced contention and efficient process tracking at a given noise robustness with less overhead in area, power and delay by maintaining a node Y at GND during evaluation phase as demanded by the input logic, said method comprising steps of; generating reference rate by appropriately biasing reference rate transistor M4 using VBIAS; charging the node Y to VDD through transistor M7 to cause feedback transistor M2 to shut OFF and node VSEN to VDD through pre-charge transistor M3 causing transistors M6 and M1 to shut OFF during pre-charge phase when clock signal is low; and turning ON one of pull down legs to discharge the charge at node Y at higher rate compared to discharge at the node VSEN causing feedback shutoff transistor M5 to turn off thereby slowing down the discharge at the node VSEN further turning on the feedback transistor M2 much faster compared to the keeper transistor M1 and thereby pulling the node VSEN to VDD by drawing large current through M2 causing M1 to shut off to maintain the node Y at GND;

DETAILED DESCRIPTION OF THE INVENTION

The primary embodiment of the present invention is an adaptive keeper circuit to control Domino Logic Dynamic Circuits using Rate Sensing Technique to provide reduced contention and efficient process tracking at a given noise robustness with less overhead in area, power and delay, said adaptive keeper comprising, keeper PMOS transistor (M1), wherein the drain of M1 is connected to wide AND-OR logic circuit; the rate controller consisting of reference rate transistor (M4), feedback PMOS transistor (M2), feedback shutoff transistor (M5), clock shutoff transistor (M6), pre-charge PMOS transistor (M3), wherein the input of the rate controller is directly connected to drain of the keeper PMOS (M1) and the output of the rate controller is directly connected to the gate of the PMOS keeper (M1), In yet another embodiment of the present invention, the technique exploits the differential rate of change of output for two cases preferably logic 0 and logic 1.

In still another embodiment of the present invention, reference rate generated through the rate controller is ranging between logic 0 rate and logic 1 rate.

In still another embodiment of the present invention, rate of change of voltage at reference node (VSEN) is compared with that of output node Y (VY).

In still another embodiment of the present invention, the keeper is turned ON if the VSEN rate is faster than VY rate or else it is kept OFF.

In still another embodiment of the present invention, the rate controller uses a transistor similar to pull down logic to achieve process tracking.

In still another embodiment of the present invention, the adaptive keeper technique ensures that the keeper is OFF at the start of the evaluation phase resulting in reduced contention and high speed.

In still another embodiment of the present invention, bias voltage at the gate input of the reference rate transistor is used to control strength of the keeper.

In still another embodiment of the present invention, value of the bias voltage and size of the reference rate transistor enables to decouple the tradeoff between noise robustness and speed of the circuit.

In still another embodiment of the present invention, the keeper design reduces the amount of short circuit power dissipation in the keeper and the feedback inverter.

In still another embodiment of the present invention, the reference rate transistor (M4) is biased with a fixed voltage reference VBIAS.

In still another embodiment of the present invention is a method of operating an adaptive keeper circuit to control Domino Logic Dynamic Circuits using Rate Sensing Technique to provide reduced contention and efficient process tracking at given noise robustness with less overhead in area, power and delay by maintaining a node Y at a voltage VDD during evaluation phase as demanded by the input logic, said method comprising steps of;

i. generating reference rate by appropriately biasing reference rate transistor M4 using VBIAS;

ii. charging the node Y to VDD through transistor M7 to cause feedback transistor M2 to shut OFF and node VSEN to VDD through pre-charge transistor M3 causing transistors M6 and M1 to shut OFF during pre-charge phase when clock signal is low;

iii. discharging the charged node VSEN at rate higher than the charged node Y causing the keeper transistor M1 to pump a larger current into node Y compared to leakage current of pull down NMOS logic which causes M2 to turn ON slowly;

iv. replenishing all the leaked charge to the node Y using the pumped current which in-turn causes the transistor M2 to slowly shut off; and v. accelerating the discharge of node VSEN to turn ON the keeper transistor M1 faster, causing the transistor M1 to turn on pulling the node Y back to VDD and thereby shutting the feedback transistor M2 off.

In still another embodiment of the present invention, the rate of discharge of the VSEN node is set by appropriately sizing the reference rate transistor M4 and by choosing VBIAS.

In still another embodiment of the present invention is a method of operating an adaptive keeper circuit to control Domino Logic Dynamic Circuits using Rate Sensing Technique to provide reduced contention and efficient process tracking at a given noise robustness with less overhead in area, power and delay by maintaining a node Y at GND during evaluation phase as demanded by the input logic, said method comprising steps of;

i. generating reference rate by appropriately biasing reference rate transistor M4 using VBIAS;

ii. charging the node Y to VDD through transistor M7 to cause feedback transistor M2 to shut OFF and node VSEN to VDD through pre-charge transistor M3 causing transistors M6 and M1 to shut OFF during pre-charge phase when clock signal is low; and iii. turning ON one of pull down legs to discharge the charge at node Y at a higher rate compared to discharge at the node VSEN causing feedback shutoff transistor M5 to turn off thereby slowing down the discharge at the node VSEN further turning on the feedback transistor M2 much faster compared to the keeper transistor M1 and thereby pulling the node VSEN to VDD by drawing large current through M2 causing M1 to shut off to maintain the node Y at GND;

In still another embodiment of the present invention, the rate of discharge of the VSEN node is set by appropriately sizing the reference rate transistor M4 and by choosing VBIAS.

Figure 3:
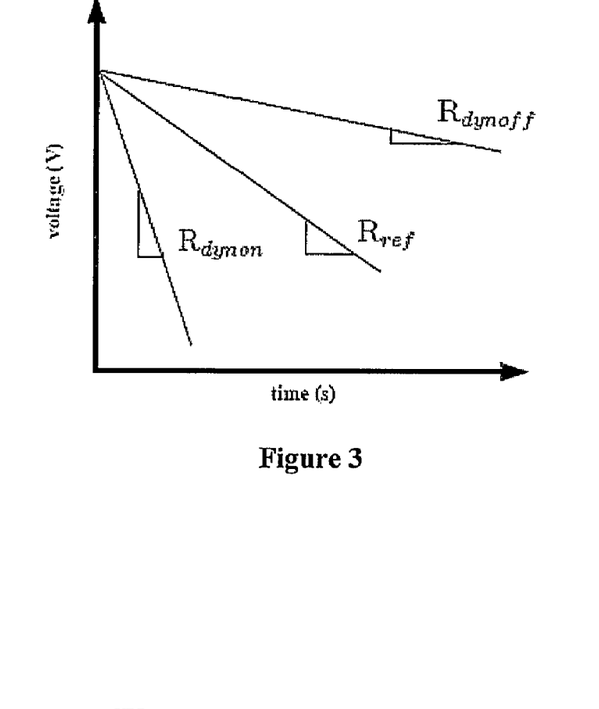
FIG. 3 shows Principle of the Rate Sensing Keeper

The proposed design has reduced contention and achieves process tracking at the given noise robustness with less overhead in area, power and delay. The design is based on the difference in the pull-down rates of the dynamic node voltage due to leakage state and the ON state during the evaluation phase. A rate, which is between the two rates is used as a reference. FIG. 3 shows the pull-down waveforms at the dynamic node during off state ($R_{dynoff}$) and during the on state ($R_{dynon}$) of the NMOS stack. A rate controller circuit compares the reference rate ($R_{ref}$) to the dynamic node rate and turns the keeper on or keeps it off based on the mode of discharge. The reference rate is exponentially dependent on the threshold voltage so that it tracks the leakage variation across the various corners.

Figure 4:
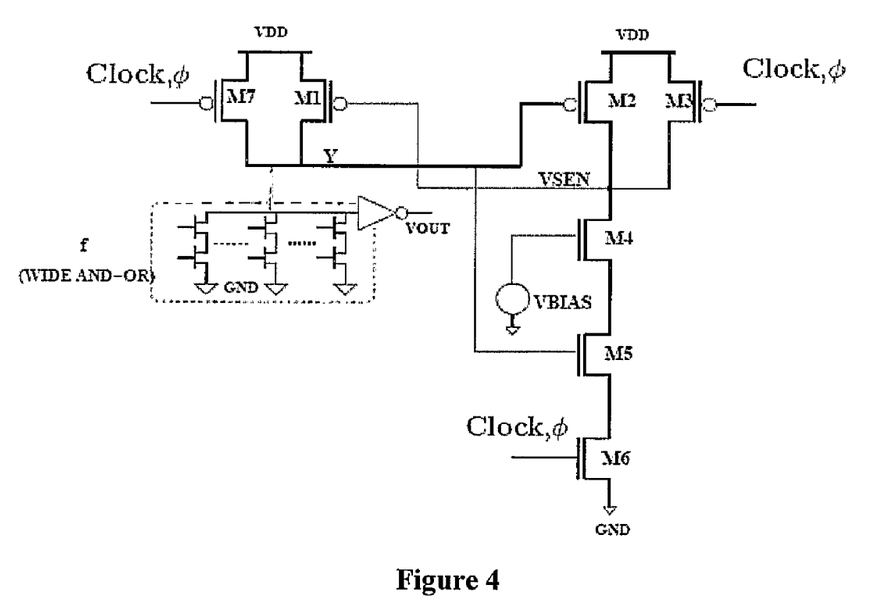
FIG. 4 shows Proposed Rate Sensing Keeper for Dynamic Gates

FIG. 4 shows the proposed keeper comprising of the keeper PMOS transistor (M1), the rate controller consisting of the reference rate transistor (M4), the feedback PMOS transistor (M2), feedback shutoff transistor (M5), clock shutoff transistor (M6) and the pre-charge transistor (M3). The reference rate is generated by appropriately biasing the transistor M4 using VBIAS. The sense node (VSEN) is pre-charged to VDD during the pre-charge cycle causing the keeper PMOS to shut off during the start of the evaluation. This reduces the contention current to a large extent. The short circuit path during pre-charge is shutoff by M6. At the start of evaluation the rate controller starts discharging at rate $R_{ref}$. This slowly turns on the keeper. But however if the dynamic node drop $R_{dyn}$ is faster than $R_{ref}$ then M2 will pump larger current into the VSEN. The discharge of VSEN is further slowed by M5 shutting off. Thus the VSEN will essentially be pulled back to VDD shutting the keeper off. However if $R_{dyn} < R_{ref}$ then VSEN would discharge completely turning the keeper ON, pulling the dynamic node Y back to VDD.

Figure 5:
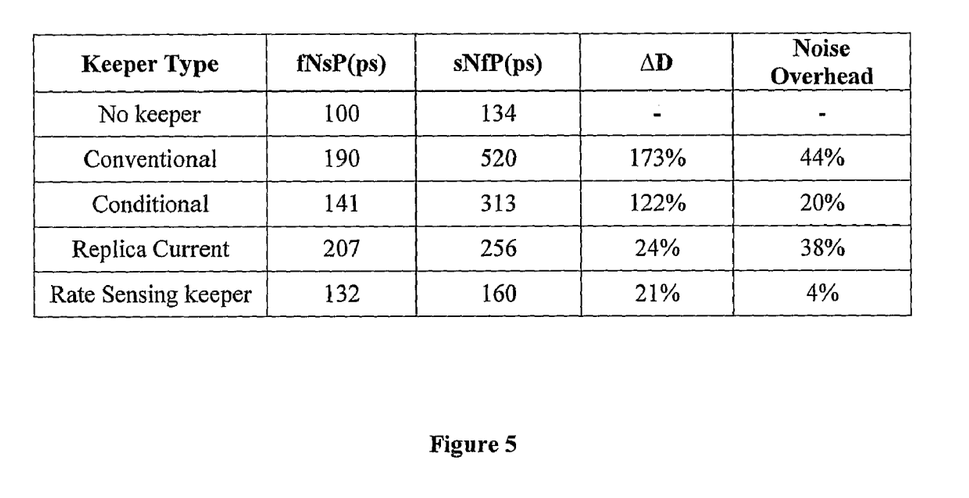
FIG. 5 shows Table summarizing the performance enhancements of the proposed keeper Technique. The results are for a 32 wide AND-OR domino logic gate in 130 nm technology. ΔD represents the percentage delay difference between the fast and the slow corner. Noise Overhead represents the increase in delay when the gate input noise is 100 mV

FIG. 5 summarizes the superior performance of the proposed technique against the existing ones. The delay for the no keeper is shown as an asymptotic value. The metric ΔD represents the percentage delay difference between the slow and fast corners with respect to the fast corner. Lower the value of ΔD better is the process tracking.

The table clearly shows that the conventional keeper technique is worse both in performance and tracking. However in case of conditional keeper technique, the absolute value of the delay in the fNsP corner has come down due to reduced contention, but the process tracking is very poor. In case of current mirror keeper, although the absolute delay overhead is high in the fNsP corner, the smaller value of ΔD indicates a better process tracking. But the rate sensing keeper has the least delay overhead of all the designs and also a smaller value of ΔD indicating a good process tracking. Noise Robustness indicates the amount of noise that the domino gate can tolerate at the gate terminal of all the input transistors. The higher the noise robustness, stronger is the keeper required. This will cause an increase in the delay. FIG. 5 shows the percentage increase in the delay at the noise robustness of 100 mV. Rate sensing keeper has the least delay overhead because the keeper provides very less contention during the evaluation period.

The proposed technique can be used as a keeper circuit for a domino logic gate. FIG. 1 represents a typical dynamic logic gate. The bottom circuit consisting of parallel NMOS legs forms the basic logic function f, which is to be evaluated. The top PMOS transistor M7 is called as the pre-charge transistor. The domino logic works on two clock phases. When the input CLK to M7 is low the voltage node Y gets charged to the supply voltage VDD through the pre-charge transistor M7. This phase of operation is called as the pre-charge cycle. By the end of the pre-charge cycle the data inputs (A0 ... AN and B0 ... BN) to the logic circuit will be ready at the input of the NMOS transistors. Now the CLK signal goes high turning the pre-charge transistor off. This phase of operation is called evaluation cycle. Because of this the node Y remains floating at VDD. Now there are two possible scenarios.

Scenario 1: If there is no conducting path from the node Y to the GND i.e., when A0 ... AN=0 or B0 ... BN=0 or A0 ... AN, B0 ... BN=0 then each of the parallel pull down leg remains OFF causing the node Y to remain at VDD. However in practical cases even when the gate input (A0 ... AN, B0 ... BN) of a transistor is zero there is a small leakage current through the transistor. This region of operation of the transistor is called the sub-threshold region. Because of this even when the pull down stack is off during the evaluation phase there is a small leakage current flowing through each of the parallel pull-down legs which causes the Y node to eventually go to zero after a certain period of time. Because of this the logic value at VOUT will be corrupted and will result in erroneous input to the subsequent stages. Also in practice the input voltage will not be perfectly zero at the gate inputs. They will have an additional noise voltage due to various non idealities in the chip. This will further add to the leakage in the circuit.

Scenario 2: However if any one of the pull down legs are ON i.e. Ai=1 and Bi=1 for any i=1 ... N then there is a conducting path from Y to the GND resulting in the discharge of Y node. This will result in the node VOUT to go to VDD and the subsequent stages will get the correct input. Now of the above two cases, discharging due to scenario 1 is not desired while that due to scenario 2 is desired. To circumvent this, a keeper PMOS transistor (M1) is introduced between the Y and VDD node. The functioning of this keeper should be such that it should minimize or compensate for the discharging in scenario 1 without affecting the discharging due to scenario 2. Suppose if the discharging current in scenario 1 is $I_{leak}$ and that during scenario 2 is $I_{on}$, an ideal keeper should provide the current $I_{leak}$ during scenario 1 and zero current during scenario 2: If the keeper does not supply the required current during scenario 1 then the Y node voltage will be less than VDD and which in turn will corrupt the node VOUT. Also if the keeper supplies some current during scenario 2 then it will contend with the pull down logic and might slow down the discharge process. The ability of the keeper to keep the Y node close to VDD during scenario 1 determines its noise robustness. The amount of current that the keeper produces during scenario 2 determines its contention with the pull-down logic.

To achieve the above conditions we propose a rate sensing keeper technique that controls keeper transistor M1 as shown in FIG. 4. The rate controller circuit consists of the reference rate transistor M4, pre-charge transistor M3, feedback PMOS transistor M2, feedback shut off transistor M5 and clock shut off transistor M6. The reference transistor is biased with a fixed voltage reference VBIAS. The node VSEN is called as the reference node.

The keeper circuit exploits the difference in the rate of discharging of node Y during scenario 1 and scenario 2. In practical situation $I_{leak} < I_{on}$ and since the capacitance $C_{dyn}$ of the node Y is fixed, the rate of discharge of the dynamic node is different in both the scenarios with scenario 2 having the fastest discharge rate. Now in the control circuitry the aim is to generate a voltage rate (reference rate) that is in between the rates of the two scenarios of the domino logic. Thus when the transistor M5 and M6 are ON, the voltage VBIAS should be, set such that the current through M4 generates a voltage rate at node VSEN that is in between the rates of the domino logic.

The detailed functioning of the control circuitry is as follows. During the pre-charge phase the clock signal is low. Node VSEN is charged to VDD through transistor M3 and Node Y is charged to VDD through transistor M7. As a result the keeper transistor M1 is OFF and the transistors M6 and M2 are also OFF. Now at the end of the pre-charge phase the clock signal goes high causing the transistors M7 and M3 to shut off and M6 to turn on. By this time the inputs to the logic pull down transistors would have settled at the gate terminals of the transistors. When the clock raises both the nodes Y and VSEN starts discharging. Consider the condition when the pull-down legs are OFF (scenario 1). The node Y discharges slowly due to leakage. However node VSEN discharges at a rate which is higher than that of Y. The discharging VSEN slowly turns on the keeper transistor M1 (due to the increasing gate voltage). Also the discharging Y turns M2 on, pumping current into VSEN. However the current through M2 is small compared to that of the discharging current through M4. Thus the node VSEN keeps discharging towards GND. However due to the faster discharge of VSEN, the transistor M1 pumps a larger current into node Y compared to the leakage current of the pull down NMOS logic. This current replenishes all the lost charge from the node Y, eventually causing the node Y to pull back to VDD. This causes the transistor M2 to slowly shutoff, accelerating the discharge of VSEN which in turn, turns on the keeper transistor M1 faster and this positive feedback finally causes the transistor M1 to turn on completely pulling the dynamic node Y back to VDD and shuts the feedback transistor M2 off causing the node VSEN to discharge completely. This is the steady state of the scenario in which the pull down stack is off. The rate of discharge of the VSEN node is set by appropriately sizing the transistor M4 and by choosing VBIAS.

Consider the scenario in which the logic pull down stack is ON. The worst case (largest delay) pull down is when only one of the pull down leg is ON. During the pre-charge phase the nodes VSEN and Y are charged to VDD. At the start of the evaluation phase both the nodes start discharging. However Y now discharges at a faster rate compared to the VSEN. Since both the nodes are pulling down, the transistor M1 and M2 both start to turn ON pumping currents into nodes Y and VSEN respectively. The current from M2 is large enough to pull back the VSEN node to VDD. Also the discharging Y node causes the transistor M5 to turn off thereby slowing down the discharge of VSEN node. This further aids in turning off the keeper. Due to this positive feedback mechanism the VSEN node is pulled back to VDD and the Y node is discharged completely to GND. The correct logic value appears at the node VOUT. This is close to the ideal keeper because during the start of the evaluation the keeper is OFF and hence there is very less contention to the pull down logic NMOS transistor. Also during the short regenerative period when the keeper is on, the contention current is very less because M1 is not completely turned on. This keeper current is small enough that the logic pulls down with a rate as that of the case when there is no keeper.

There are certain metrics that can help us in evaluating the usefulness of a keeper technique. The ideal requirements of a keeper are zero contention current, very good process tracking, less area and power overhead and good noise robustness.

Contention Current:

As explained earlier, contention current refers to the amount of keeper (M1) current flowing into the dynamic node (Y) during the transition window in which the pull down NMOS logic is turned on (scenario 2). This contention current will resist the dynamic node from discharging thus slowing down the transition and causes increased delay. In the previous keeper techniques [1][5][6] the PMOS keeper transistor is ON during the beginning of the evaluation which causes a large contention current to flow into the dynamic node. In this technique the keeper is OFF during the beginning of the evaluation thus resulting in a very less contention current. This helps the NMOS logic to pull down at a faster rate than other keeper techniques, resulting in high speed circuit.

Process Tracking:

The NMOS transistors of the pull-down logic block need not be of the same kind throughout all the logic gates either within the chip or from chip to chip. They can vary in their threshold voltage during chip manufacturing which in turn will cause the leakage to vary from one domino gate to the other. When the threshold voltage is high compared to the nominal value we call it a slow corner and when the threshold voltage is low compared to the nominal value we call it a fast corner. The leakage current is related exponentially to the threshold voltage. Hence the difference in leakage currents between the fast and the slow corners can be very large. Ideally we require a keeper which should supply only the required amount of leakage current to the pull-down logic. Thus the keeper has to determine the process corner of the NMOS pull down logic and supply the leakage current accordingly. Normally the PMOS and NMOS transistors are fabricated using different process steps and they need not have the same corner values. So the worst case might be that the NMOS pull down logic is in slow corner requiring very less leakage current whereas the PMOS keeper turns out to be in the fast corner where it can supply a larger current. This is a problem in a conventional keeper circuit where we have only the PMOS keeper supplying the leakage current. This can severely impact the performance of the domino gate. The principle of the proposed keeper is based on the rate of voltage drop at the dynamic node. During the condition when the NMOS pull down stack is OFF (scenario 1), the rate is dependent on the leakage current which in turn is exponentially dependent on the threshold voltage. Thus the voltage rate of node Y during scenario 1 varies exponentially based on the corners. The reference rate that is generated by the control circuit should also vary exponentially and must track the Y rate. This will ensure that the keeper turns on during the conditions when the pull down stack is turned off. This exponential dependence of the reference rate is achieved by having the VBIAS voltage such that transistor M4 remains in sub-threshold region where the leakage current is an exponential function of the gate voltage. Also the transistor M4 is of the same type as that of the NMOS transistors in the pull down logic so that it tracks the variations in those transistors. Also for better process tracking the logic that tracks the process corner must be in close proximity to the respective domino gate. In case of [6] there is one common reference transistor for a large number of domino gates which may not give a good process tracking in case of large within die variations.

Noise Robustness:

During the condition when the NMOS pull down logic is OFF, in addition to the leakage current there can be noise voltages at the inputs of the NMOS transistors. The robustness of the gate to this noise voltage is an important metric for the domino logic gates. The keeper should also provide for the additional pull down current caused due to the noise voltage. The robustness of the gate is normally measured in terms of the amount of noise voltage that can be applied at the inputs of all the transistors such that the voltage at VOUT does not exceed the input noise voltage. Since the leakage current increases exponentially with input noise, the keeper size should also increase accordingly causing an exponential increase in the contention current. This will result in an exponential increase in the pull down delay. This is the condition in most of the previous keeper techniques [1][5][6]. However in case of the proposed keeper technique there is reduced contention current (since the keeper is off) during the pull down operation. Thus for increasing noise robustness though the keeper size increases, the delay does not increase exponentially but remains almost constant.

Area and Power Overhead:

The keeper circuit has to be used for every domino logic gate. So it should have considerably less area compared to the domino gate itself. Also the power consumed by the keeper should be less compared to the total domino gate power. In case of conventional keeper though the area is very less, the power consumed is high due to the high contention current flowing through the keeper and the short circuit current in the output inverter. In case of the conditional keeper [4] the area and power overhead is high because of the additional buffers inserted in the delay chain. The current mirror keeper [6] has a large reference transistor through which a large amount of static current flows, causing huge power dissipation. In case of the proposed keeper there is very less contention current and hence less short circuit current. Also the control circuit does not have any static current path resulting in lower power dissipation. Also the transistors used are of minimum size resulting in less area overhead. Thus the proposed rate sensing keeper design provides reduced contention current and efficient process tracking at a given noise robustness with less overhead in area, power and delay.

The following are important features of the invention

1. An adaptive keeper circuit technique to control the domino logic dynamic circuits that has very low contention with switching the output, while tracking the process variations efficiently.

2. The circuit technique that exploits the differential rate of change of output for two cases, namely logic 0 and logic 1 at the output.

3. We further claim the circuit technique which generates a reference rate through a reference rate transistor, such that the reference rate is in between logic 0 rate and logic 1 rate.

4. The adaptive keeper circuit where the rate of change of voltage at reference node (VSEN) is compared with that of the output node Y (VY). If the VSEN rate is faster than the VY rate then the keeper is turned on, else it is kept off 5. The rate controller uses a transistor which is similar to the pull down logic to achieve process tracking.

6. The adaptive keeper technique which ensures that the keeper is OFF at the start of the evaluation phase thus resulting in reduced contention and high speed.

7. The adaptive keeper circuit where the bias voltage at the gate input of the reference rate transistor is used to control the strength of the keeper.

8. The adaptive keeper circuit where in the value of the bias voltage and the size of the reference rate transistor can be adapted to the number of pull down legs in a wide AND-OR logic.

9. The adaptive keeper circuit where in the adaptation of bias voltage and size of the reference rate transistor enables to decouple the tradeoff between the noise robustness and speed of the circuit. Improving the noise robustness by increasing the bias voltage does not degrade the performance of the gate because the keeper is off when the NMOS logic pulls down.

10. The adaptive keeper circuit wherein the amount of short circuit power dissipation in the keeper and the feedback inverter is reduced significantly.

11. While the circuit in FIG. 4 represents a particular embodiment of the proposed technique, it is possible to construct other variants based on the central theme of this invention—namely, to exploit the differential rates in logic 0 and logic 1 states. For e.g. by removing the feedback shutoff transistor M5 from the circuit in FIG. 4, the rate sensing circuit shows better process tracking characteristics.

REFERENCES

1. Steven K. Hsu et al., "Robust variable keeper strength process-compensated dynamic circuit and method," U.S. Pat. No. 7,002,375, Feb. 21, 2006.

2. Gauthier et al., "Adaptive keeper sizing for dynamic circuits based on fused process corner data," U.S. Pat. No. 6,914,452, Jul. 5, 2005.

3. Gauthier et al., "Process monitor based keeper scheme for dynamic circuits," U.S. Pat. No. 6,894,528, May 17, 2005.

4. Atila Alvandpour, K. Soumyananth and Shekhar Y. Borkar, "A Sub-130 nm Conditional Keeper Technique", IEEE Journal of Solid State Circuits, Vol 37, No. 5, Pg 633, May 2002.

5. Hazucha et al., "Dynamic gate with conditional keeper for soft error rate reduction," U.S. Pat. No. 7,053,663, May 30, 2006.

6. Yolin Lih, Nestoras Tzartzanis and William W. Walker, "A Leakage Current Replica Keeper for Dynamic Circuits", IEEE Solid State Circuits Conference, 2006.

We claim:

1. An adaptive keeper circuit to control Domino Logic Dynamic Circuits using Rate Sensing Technique to provide reduced contention and efficient process tracking at given noise robustness with less overhead in area, power and delay, said keeper comprising:
   i. keeper PMOS transistor (M1) wherein drain of M1 connected to WIDE AND-OR logic circuit;
   ii. rate controller consisting of reference rate transistor (M4), feedback PMOS transistor (M2), feedback shutoff transistor (M5), clock shutoff transistor (M6) and the pre-charge transistor (M3),
   iii. wherein input of the rate controller is directly connected to the drain of the keeper PMOS (M1) and output of the rate controller connected to gate terminal of the keeper PMOS transistor (M1).

2. The circuit as claimed in claim 1, wherein the technique exploits the differential rate of change of output for two cases preferably logic 0 and logic 1.

3. The circuit as claimed in claim 1, wherein reference rate generated through the rate controller is ranging between logic 0 rate and logic 1 rate.

4. The circuit as claimed in claim 1, wherein rate of change of voltage at reference node (VSEN) is compared with that of output node Y (VY).

5. The circuit as claimed in claims 1 or 4, wherein the keeper is turned ON if the VSEN rate is faster than VY rate or else it is kept OFF.

6. The circuit as claimed in claim 1, wherein the rate controller uses a transistor similar to pull down logic to achieve process tracking.

7. The circuit as claimed in claim 1, wherein the adaptive keeper technique ensures that the keeper is OFF at the start of the evaluation phase resulting in reduced contention and high speed.

8. The circuit as claimed in claim 1, wherein bias voltage at the gate input of the reference rate transistor is used to control strength of the keeper.

9. The circuit as claimed in claims 1 or 8, wherein value of the bias voltage and size of the reference rate transistor enables to decouple the tradeoff between noise robustness and speed of the circuit.

10. The circuit as claimed in claim 1, wherein the keeper design reduces the amount of short circuit power dissipation in the keeper and the feedback inverter.

11. The circuit as claimed in claim 1, wherein the reference rate transistor (M4) is biased with a fixed voltage reference VBIAS.

12. A method of operating an adaptive keeper circuit to control Domino Logic Dynamic Circuits using Rate Sensing Technique to provide reduced contention and efficient process tracking at given noise robustness with less overhead in area, power and delay by maintaining a node Y at a voltage VDD during evaluation phase as demanded by the input logic, said method comprising steps of:
   i. generating reference rate by appropriately biasing reference rate transistor M4 using VBIAS;
   ii. charging the node Y to VDD through transistor M7 to cause feedback transistor M2 to shut OFF and node VSEN to VDD through transistor M3 causing transistors M6 and M1 to shut OFF during pre-charge phase when clock signal is low;
   iii. discharging the charged node VSEN at rate higher than the charged node Y causing the keeper transistor M1 to pump a larger current into node Y compared to leakage current of pull down NMOS logic which causes M2 to turn ON slowly;

iv. replenishing all the leaked charge to the node Y using the pumped current which in-turn causes the transistor M2 to slowly shut off; and v. accelerating the discharge of node VSEN to turn ON the keeper transistor M1 faster, causing the transistor M1 to turn on pulling the node Y back to VDD and thereby shutting the feedback transistor M2 off.

13. The method as claimed in claim 12, wherein the rate of discharge of the VSEN node is set by appropriately sizing the reference rate transistor M4 and by choosing VBIAS.

14. A method of operating an adaptive keeper circuit to control Domino Logic Dynamic Circuits using Rate Sensing Technique to provide reduced contention and efficient process tracking at a given noise robustness with less overhead in area, power and delay by maintaining a node Y at GND during evaluation phase as demanded by the input logic, said method comprising steps of:

i. generating reference rate by appropriately biasing reference rate transistor M4 using VBIAS;

ii. charging the node Y to VDD through transistor M7 to cause feedback transistor M2 to shut OFF and node VSEN to VDD through transistor M3 causing transistors M6 and M1 to shut OFF during pre-charge phase when clock signal is low; and iii. turning ON one of pull down legs to discharge the charge at node Y at a higher rate compared to discharge at the node VSEN causing feedback shutoff transistor M5 to turn off thereby slowing down the discharge at the node VSEN further turning on the feedback transistor M2 much faster compared to the keeper transistor M1 and thereby pulling the node VSEN to VDD by drawing large current through M2 causing M1 to shut off to maintain the node Y at GND.

15. The method as claimed in claim 14, wherein the rate of discharge of the VSEN node is set by appropriately sizing the transistor M4 and by choosing VBIAS.

* * * * *